US012785632B2

(12) United States Patent
Honda et al.

(10) Patent No.: US 12,785,632 B2
(45) Date of Patent: Nov. 3, 2026

(54) POWER AMPLIFIER CIRCUIT

(71) Applicant: Murata Manufacturing Co., Ltd., Kyoto (JP)

(72) Inventors: Yuri Honda, Kyoto (JP); Hideyuki Sato, Kyoto (JP); Satoshi Tanaka, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 747 days.

(21) Appl. No.: 18/189,402

(22) Filed: Mar. 24, 2023

(65) Prior Publication Data

US 2023/0308059 A1 Sep. 28, 2023

(30) Foreign Application Priority Data

Mar. 25, 2022 (JP) ................................. 2022-050198

(51) Int. Cl.
*H03F 3/21* (2006.01)
*H03F 1/02* (2006.01)

(52) U.S. Cl.
CPC ........... *H03F 3/211* (2013.01); *H03F 1/0222* (2013.01); *H03F 2200/451* (2013.01)

(58) Field of Classification Search
CPC .. H03F 3/211; H03F 1/0222; H03F 2200/451; H03F 1/0216; H03F 2200/06; H03F 2200/09; H03F 3/193; H03F 3/195; H03F 3/245; H03F 1/0261
USPC ....... 330/295, 124 R, 301, 285–286, 296, 84
See application file for complete search history.

(56) References Cited

U.S. PATENT DOCUMENTS

2018/0375474 A1 12/2018 Namie
2022/0329206 A1 * 10/2022 Seebacher ............. H03F 3/4552

FOREIGN PATENT DOCUMENTS

JP 2018-195954 A 12/2018

* cited by examiner

*Primary Examiner* — Andrea Lindgren Baltzell
*Assistant Examiner* — Malane Lieng
(74) *Attorney, Agent, or Firm* — McDonald Hopkins LLC

(57) ABSTRACT

A power amplifier circuit includes a first amplification element having an output terminal and amplifying a harmonic signal input to an input terminal, a second amplification element having an output terminal and amplifying a harmonic signal input to an input terminal, a bias circuit that supplies a bias to each of the input terminal of the first amplification element and the second amplification element, a first resistance element electrically connected to the output terminal of the first amplification element, and a second resistance element electrically connected to the output terminal of the second amplification element and electrically connected to the other end of the first resistance element in series, the bias circuit is electrically connected to a connection point in a portion in which the other end of the first resistance element and the other end of the second resistance element are electrically connected in series.

17 Claims, 9 Drawing Sheets

POWER AMPLIFIER CIRCUIT

CROSS REFERENCE TO RELATED APPLICATION

This application claims priority from Japanese Patent Application No. 2022-050198 filed on Mar. 25, 2022. The content of this application is incorporated herein by reference in its entirety.

BACKGROUND ART

The present disclosure relates to a power amplifier circuit.

A power amplifier circuit for amplifying an RF (Radio Frequency) signal transmitted to a base station is used in a mobile communication terminal such as a cellular phone. The power amplifier circuit includes, for example, a transistor for amplifying the RF signal and a bias circuit for controlling a bias point of the transistor. However, the power amplifier circuit including the bias circuit has a possibility that characteristics of gain dispersion may deteriorate. Here, the term "gain dispersion" indicates a difference in gain with respect to change in a power supply voltage supplied to the transistor. Japanese Unexamined Patent Application Publication No. 2018-195954 discloses a power amplifier circuit including a circuit to improve the characteristics of the gain dispersion.

The power amplifier circuit disclosed in Japanese Unexamined Patent Application Publication No. 2018-195954 includes an adjustment circuit for holding the gain dispersion within a proper depending width. The adjustment circuit is disposed between a collector power supply in an input stage and a bias circuit in an output stage. In the disclosed power amplifier circuit, there is a problem that, when the adjustment circuit is disposed to be connected to a collector power supply in the output stage, a harmonic signal flows into the bias circuit in the output stage. In other words, the disclosed power amplifier circuit causes a problem that, when the adjustment circuit is connected to a collector power supply for an amplification element and is connected between the collector power supply and the bias circuit for the amplification element, a harmonic signal flows into the bias circuit.

BRIEF SUMMARY

The present disclosure provides a power amplifier circuit capable of suppressing a harmonic signal from flowing into a bias circuit while improving the characteristics of the gain dispersion.

The present disclosure provides a power amplifier circuit including a first amplification element having an output terminal to which a power supply voltage is supplied and amplifying a harmonic signal input to an input terminal, a second amplification element forming a differential amplifier circuit in cooperation with the first amplification element, having an output terminal to which the power supply voltage is supplied, and amplifying a RF signal input to an input terminal, a bias circuit that supplies a bias to each of the input terminal of the first amplification element and the input terminal of the second amplification element, a first resistance element with one end electrically connected to the output terminal of the first amplification element, and a second resistance element with one end electrically connected to the output terminal of the second amplification element and the other end electrically connected to the other end of the first resistance element in series, wherein the bias circuit is electrically connected to a connection point in a portion in which the other end of the first resistance element and the other end of the second resistance element are electrically connected in series.

With the power amplifier circuit according to the present disclosure, the harmonic signal can be suppressed from flowing into a bias circuit while the characteristics of the gain dispersion are improved.

DETAILED DESCRIPTION

Embodiments of the present disclosure will be described below with reference to the drawings. In the following, circuit elements denoted by the same reference signs are to be construed as representing the same circuit elements, and duplicate description of those circuit elements is omitted.

Power Amplifier Circuit 100 According to First Embodiment

Figure 1:
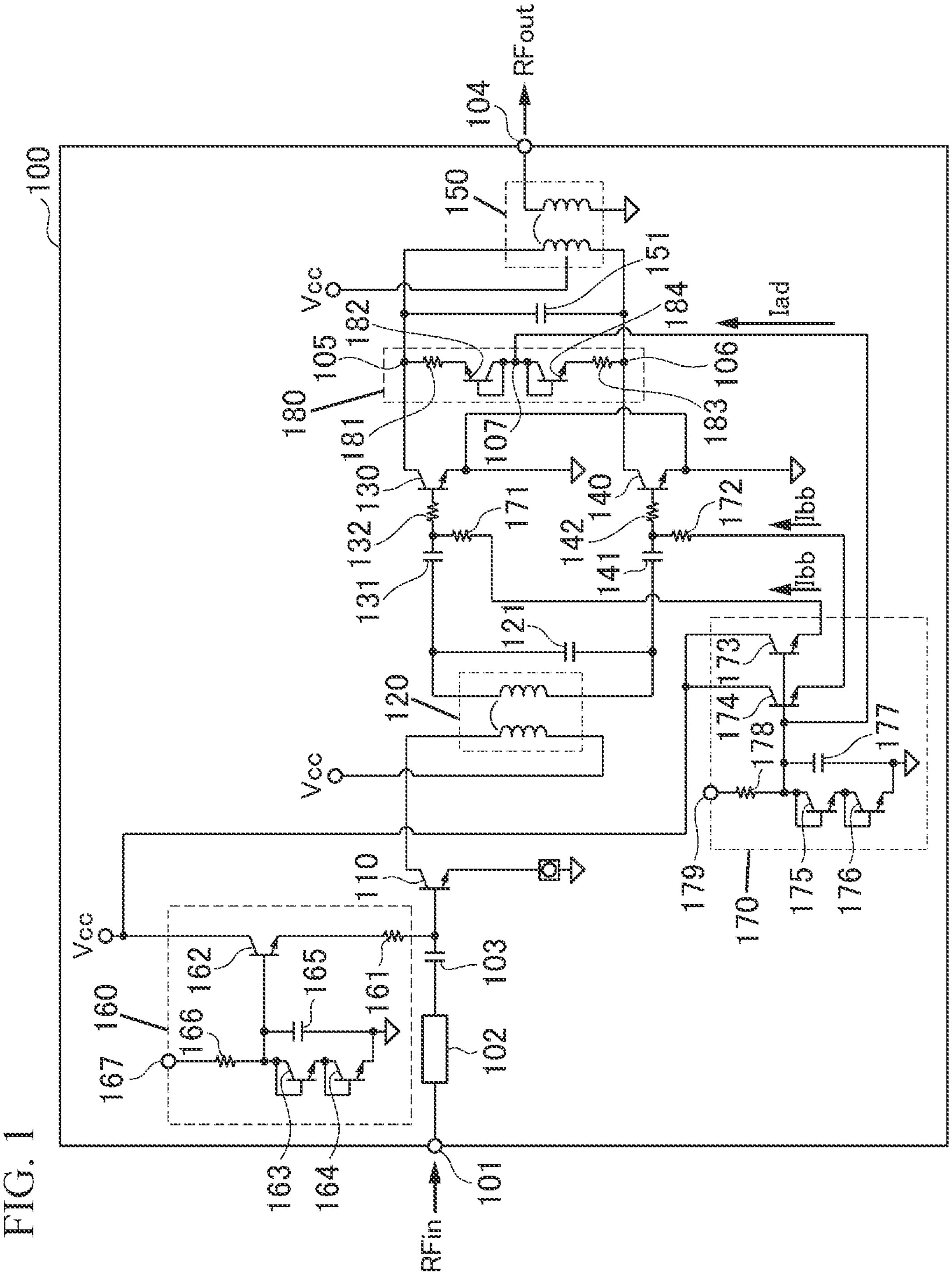
FIG. 1 illustrates an example of configuration of a power amplifier circuit 100 according to a first embodiment.

A power amplifier circuit 100 according to a first embodiment is described with reference to FIG. 1. FIG. 1 illustrates an example of configuration of the power amplifier circuit 100 according to the first embodiment. The power amplifier circuit 100 is mounted in, for example, a mobile communication device, such as a cellular phone. The power amplifier circuit 100 amplifies power of an input signal RFin to a level suitable for transmission to a base station and outputs the amplified power as an amplified signal RFout. The input signal RFin is an RF (Radio Frequency) signal modulated by, for example, an RFIC (Radio Frequency Integrated Circuit) or the like in accordance with a predetermined communication method. The communication standard for the input signal RFin is, for example, 2G (2nd Generation Mobile Communication System), 3G (3rd Generation Mobile Communication System), 4G (4th Generation Mobile Communication System), 5G (5th Generation Mobile Communication System), LTE (Long Term Evolution)—FDD (Frequency Division Duplex), LTE-TDD (Time Division Duplex), LTE-Advanced, or LTE-Advanced Pro. A frequency of the input signal RFin is about several hundred MHz to several ten GHz. The communication standard and the frequency of the input signal RFin are not limited to the above-described examples.

Configuration

As illustrated in FIG. 1, the power amplifier circuit 100 includes a transistor 110, a balun 120, transistors 130 and 140, a balun 150, bias circuits 160 and 170, and an adjustment circuit 180. While the transistors 110, 130 and 140 are described as bipolar transistors in the following, they may be FETs (Field-Effect Transistors). In the latter case, a current, a base, a collector, and an emitter are to be replaced with a voltage, a gate, a drain, and a source, respectively, in reading the description.

In an example, the transistor 110 is an amplification element in a driver stage. The input signal RFin is input to a base of the transistor 110 from an input terminal 101 through a matching circuit 102 and a capacitor 103. The balun 120 to which a varying power supply voltage Vcc is supplied is connected to a collector of the transistor 110. In other words, the transistor 110 amplifies the input signal RFin input to the base and outputs the amplified signal RF from the collector.

In an example, the balun 120 splits the input amplified signal RF into multiple signals. In the following description, the multiple signals are assumed to be an amplified signal RF1 and an amplified signal RF2. The varying power supply voltage Vcc is supplied to the balun 120. A capacitor 121 for matching adjustment is connected in parallel to an output side of the balun 120. The balun 120 splits the amplified signal RF1 into, for example, the amplified signal RF1 and the amplified signal RF2 that has a phase difference of about 180 degrees relative to the amplified signal RF1. The wording “about 180 degrees” includes a range of, for example, 135 degrees to 225 degrees. The amplified signal RF1 is input to a base of the transistor 130. The amplified signal RF2 is input to a base of the transistor 140. The balun 120 may be another suitable member without necessarily being limited to the use of a balun.

In an example, the transistor 130 and the transistor 140 are amplification elements in an output stage and form a differential amplifier circuit. The respective bases of the transistor 130 and the transistor 140 are connected to the balun 120, and the amplified signals with the phase difference of about 180 degrees therebetween are input to those transistors. The amplified signal RF1 is input to the base of the transistor 130 through a capacitor 131 and a resistance 132. A bias current Ibb is also input to the base of the transistor 130 from the bias circuit 170 through a resistance 171. On the other hand, the amplified signal RF2 is input to the base of the transistor 140 through a capacitor 141 and a resistance 142. A bias current Ibb is also input to the base of the transistor 140 from the bias circuit 170 through a resistance 172. Emitters of the transistor 130 and the transistor 140 are connected to a reference potential. Collectors of the transistor 130 and the transistor 140 are connected to the balun 150. An amplified signal RF11 resulting after amplification of the amplified signal RF1 is output from the collector of the transistor 130. An amplified signal RF21 resulting after amplification of the amplified signal RF2 is output from the collector of the transistor 140.

In an example, the balun 150 combines multiple amplified signals input thereto. The varying power supply voltage Vcc is supplied to the balun 120. A capacitor 151 for matching adjustment is connected in parallel to an input side of the balun 150. The amplified signal RF11 from the transistor 130 and the amplified signal RF21 from the transistor 140 are input to the balun 150. The balun 150 outputs a combined amplified signal RFout to an output terminal 104.

In an example, the bias circuit 160 supplies a bias current to the base of the transistor 110 through a resistance 161. The bias circuit 160 includes a transistor 162, diodes 163 and 164, and a capacitor 165. The transistor 162 is an emitter-follower transistor. A base of the transistor 162 is connected to an anode of the diode 163 and is further connected to the ground through the capacitor 165. An emitter of the transistor 162 is connected to the base of the transistor 110 through the resistance 161. The anode of the diode 163 is connected to a power supply terminal 167 through a resistance 166. The power supply terminal 167 supplies a constant voltage or current. The cathode of the diode 163 is connected to a anode of the diode 164. The cathode of the diode 164 is connected to the ground. The diodes 163 and 164 are each a diode-connected bipolar transistor.

In an example, the bias circuit 170 supplies the bias current Ibb to each of the bases of the transistors 130 and 140 through the resistances 171 and 172, respectively. The bias circuit 170 includes transistors 173 and 174, diodes 175 and 176, and a capacitor 177. The transistors 173 and 174 are each an emitter-follower transistor. Bases of the transistors 173 and 174 are connected to an anode of the diode 175 and are further connected to the ground through the capacitor 177. The capacitor 177 serves as, for example, a capacitor for keeping constant base voltages of the transistors 173 and 174. An emitter of the transistor 173 is connected to the base of the transistor 130 through the resistance 171. An emitter of the transistor 174 is connected to the base of the transistor 140 through the resistance 172. The bases of the transistors 173 and 174 are connected to the adjustment circuit 180 described later. The anode of the diode 175 is connected to a power supply terminal 179 through a resistance 178. The power supply terminal 179 supplies a constant voltage or current (hereinafter referred to as a “control voltage”). An anode of the diode 176 is connected to a cathode of the diode 175. A cathode of the diode 176 is connected to the ground. The diodes 175 and 176 are each a diode-connected bipolar transistor.

In an example, the adjustment circuit 180 is a circuit for adjusting a gain of the power amplifier circuit 100 depending on a magnitude of the varying power supply voltage Vcc that is supplied to the collectors of the transistor 130 and the transistor 140. The adjustment circuit 180 is electrically connected between a node 105 which is disposed in a wiring between the collector of the transistor 130 and the balun 150 and a node 106 which is disposed in a wiring between the collector of the transistor 140 and the balun 150. More specifically, the adjustment circuit 180 includes, for example, a resistance 181 with one end connected to the node 105, and a diode 182 with a cathode connected to the other end of the resistance 181 and an anode connected to a connection point 107. The connection point 107 is, for example, a predetermined point in a portion in which the other end of the resistance 181 and the other end of a resistance 183 are electrically connected in series. The adjustment circuit 180 further includes, for example, the resistance 183 with one end connected to the node 106, and a diode 184 with a cathode connected to the other end of the resistance 183 and an anode connected to the connection point 107. The resistance 181 and the resistance 183 are, for example, resistance elements for adjusting a bias point. The diode 182 and the diode 184 each serves as, for example, a diode for a level shifter. In the adjustment circuit 180, the connection point 107 becomes a virtual ground because the transistor 130 and the transistor 140 form the differential amplifier circuit. Accordingly, the amplified signal RF1 and the amplified signal RF2 can be avoided from interfering with the bias circuit 170. Furthermore, even when the connection point 107 does not become the virtual ground, the diode 182 and the diode 184 have the effect of suppressing the interference of the amplified signal RF1 and the amplified signal RF2. In more detail, even when the connection point 107 does not become the virtual ground, a current flows through one of the diodes 182 and 184, through which any current is supposed not to flow, due to the influence of a parasitic capacitance, and therefore the connection point 107 comes closer to a state of the virtual ground. This results in the effect of suppressing the amplitudes of the amplified signal RF1 and the amplified signal RF2 at the connection point 107 and hence suppressing the interference of those signals. The bases of the transistor 173 and the transistor 174 in the bias circuit 170 are connected to the connection point 107. The diode 182 and the diode 184 may be each a diode-connected bipolar transistor. In the configuration of the power amplifier circuit 100, a position of the resistance 181 and a position of the diode 182, illustrated in FIG. 1, may be replaced with each other. In the configuration of the power amplifier circuit 100, a position of the resistance 183 and a position of the diode 184, illustrated in FIG. 1, may be replaced with each other.

Operation

Figure 2:
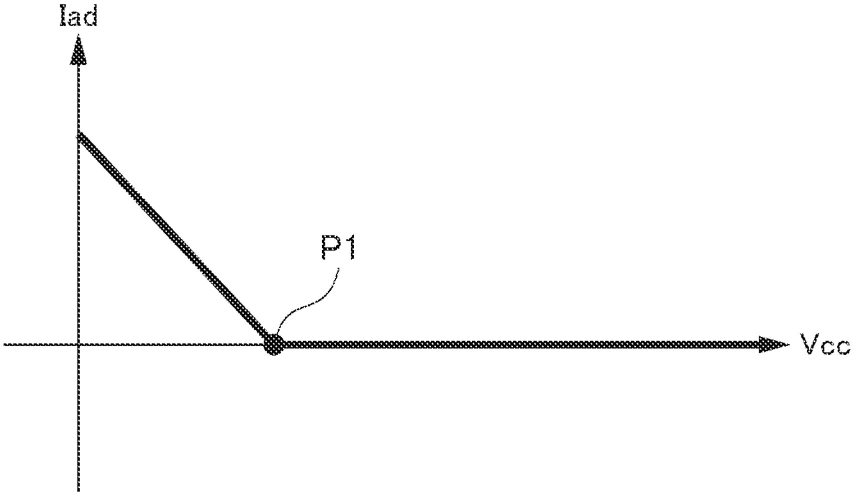
FIG. 2 is a graph indicating a relationship between a varying power supply voltage Vcc and an adjustment current Iad flowing from a bias circuit 170 to an adjustment circuit 180 in an operation of the power amplifier circuit 100.
Figure 3:
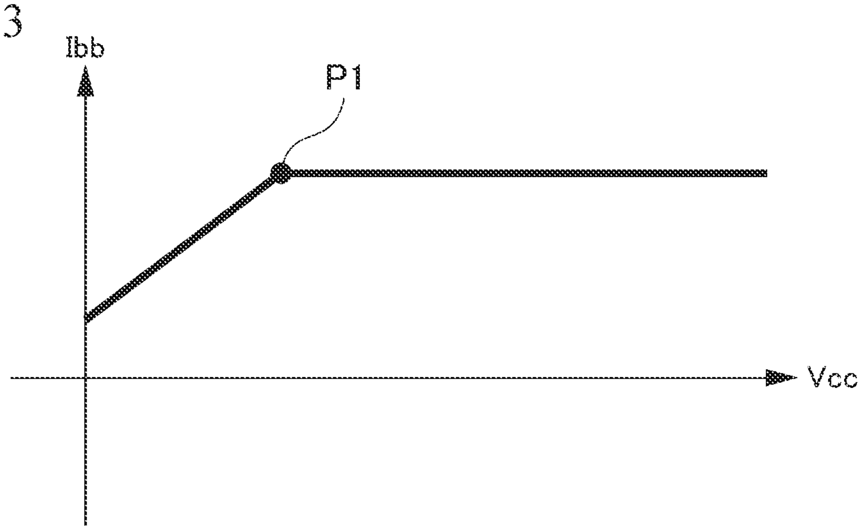
FIG. 3 is a graph indicating a relationship between the varying power supply voltage Vcc and a bias current Ibb flowing from the bias circuit 170 to each of a transistor 130 and a transistor 140 in the operation of the power amplifier circuit 100.
Figure 4:
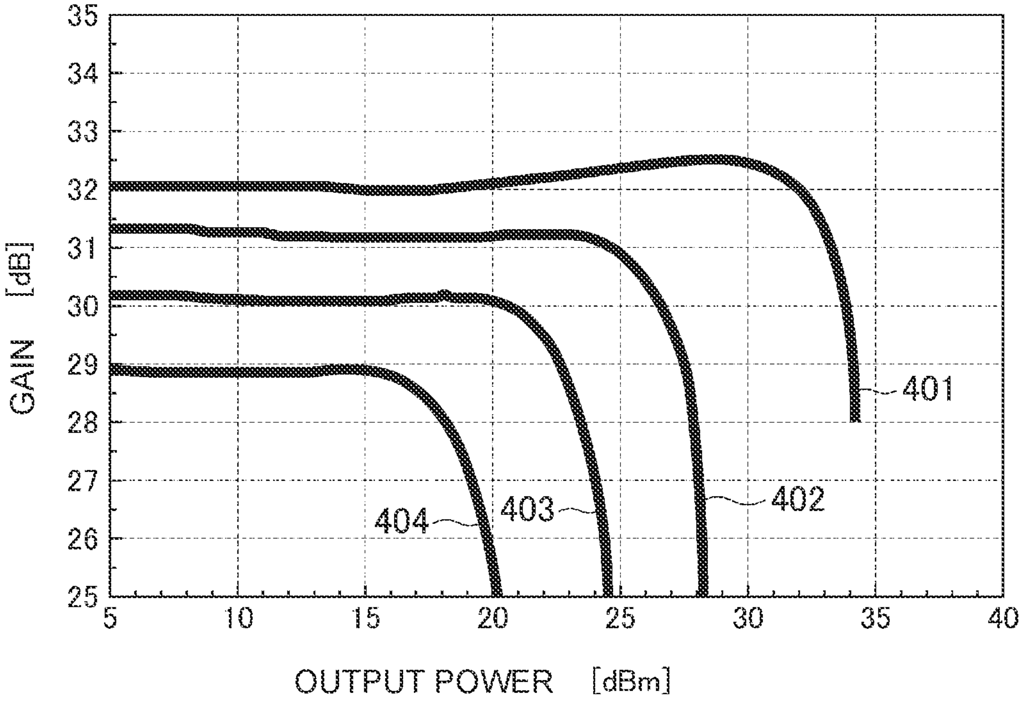
FIG. 4 is a graph indicating a gain of the power amplifier circuit 100.
Figure 5:
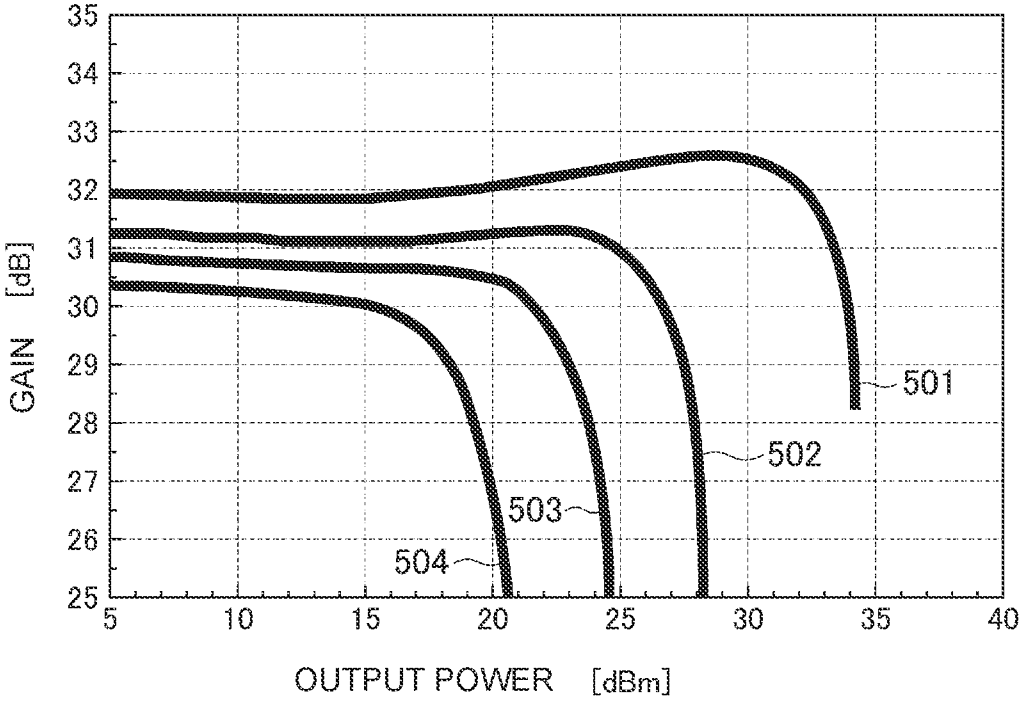
FIG. 5 is a graph indicating a gain of a power amplifier circuit according to a comparative example.

An operation of the power amplifier circuit 100 will be described below with reference to FIGS. 1, 2, 3, 4, and 5. FIG. 2 is a graph indicating a relationship between the varying power supply voltage Vcc and an adjustment current Iad flowing from the bias circuit 170 to the adjustment circuit 180 in the operation of the power amplifier circuit 100. In FIG. 2, the horizontal axis represents the varying power supply voltage Vcc, and the vertical axis represents the adjustment current Iad. FIG. 3 is a graph indicating a relationship between the varying power supply voltage Vcc and the bias current Ibb flowing from the bias circuit 170 to each of the transistor 130 and the transistor 140 in the operation of the power amplifier circuit 100. In FIG. 3, the horizontal axis represents the varying power supply voltage Vcc, and the vertical axis represents the bias current Ibb. FIG. 4 is a graph indicating a gain of the power amplifier circuit 100. FIG. 5 is a graph indicating a gain of a power amplifier circuit (not illustrated) according to a comparative example. In FIGS. 4 and 5, the horizontal axis represents an output power Pout, and the vertical axis represents the gain of the power amplifier circuit. Here, the power amplifier circuit (not illustrated) according to the comparative example is, for example, a power amplifier circuit in which the differential amplifier circuit is not formed in an output stage and the adjustment circuit 180 is not disposed as compared with the power amplifier circuit 100.

In the power amplifier circuit 100, when the varying power supply voltage Vcc exceeds below a voltage value ("P1" in FIG. 2) resulting from subtracting a base-emitter voltage Vbe of the diode 182 and a voltage drop across the resistance 181 from a base potential Vb of the transistor 173, the adjustment current Iad flows from the bias circuit 170 to the adjustment circuit 180. Similarly, when the varying power supply voltage Vcc exceeds below a voltage value resulting from subtracting a base-emitter voltage Vbe of the diode 184 and a voltage drop across the resistance 183 from a base potential Vb of the transistor 174, the adjustment current Iad flows from the bias circuit 170 to the adjustment circuit 180.

More specifically, it is assumed that collector voltages of the transistor 130 and the transistor 140 are as low as 0 V to 1.0 V due to the varying power supply voltage Vcc. On the other hand, it is also assumed that a constant voltage (base potentials Vb of the transistors 173 and 174) of about 2.0 V, for example, is supplied to the connection point 107 from the bias circuit 170. Thus, as illustrated in FIG. 2, when the voltage value ("P1" in FIG. 2) resulting from subtracting the voltage Vbe (about 1.0 V to 1.2 V) across the diode 182 and the diode 184 and the voltage drop across the resistance 181 and the resistance 183 from the voltage (here 2.0 V) at the connection point 107 is larger than a voltage value of the collector voltages (here 0 V to 1.0 V) of the transistor 130 and the transistor 140, the adjustment current Iad flows from the bias circuit 170 toward the connection point 107.

With the adjustment current Iad flowing toward the connection point 107, base currents in the transistors 173 and 174 reduce. In this case, as illustrated in FIG. 3, the bias current Ibb supplied to each of the bases of the transistor 130 and the transistor 140 from the transistors 173 and 174, respectively, reduces. Accordingly, the gain of the power amplifier circuit 100 reduces. In other words, the adjustment circuit 180 operates to reduce the gain of the power amplifier circuit 100 when the varying power supply voltage Vcc is small. As a result, the power amplifier circuit 100 can improve the gain dispersion as compared with that in the power amplifier circuit (not illustrated) according to the comparative example.

An example of the improvement in characteristics of the gain dispersion will be described below. FIG. 4 plots the gains when the varying power supply voltage Vcc of the power amplifier circuit 100 is set to 3.8 V (denoted by a sign 401), 2 V (denoted by a sign 402), 1.4 V (denoted by a sign 403), and 1 V (denoted by a sign 404). FIG. 5 plots the gains when the varying power supply voltage Vcc of the power amplifier circuit according to the comparative example is set to 3.8 V (denoted by a sign 501), 2 V (denoted by a sign 502), 1.4 V (denoted by a sign 503), and 1 V (denoted by a sign 504). In the power amplifier circuit 100, as illustrated in FIG. 4, when the output voltage is 5 dBm, for example, a gain width is 3 dB. On the other hand, in the power amplifier circuit according to the comparative example, as illustrated in FIG. 5, when the output voltage is 5 dBm, for example, the gain width is 1.5 dB. Thus, the characteristics of the gain dispersion can be improved by forming the differential amplifier circuit in the output stage and by disposing the adjustment circuit 180.

Furthermore, as illustrated in FIG. 1, the adjustment circuit 180 included in the power amplifier circuit 100 has a symmetric configuration between the two transistors in the differential amplifier circuit in the output stage with the connection point 107 being a center. Therefore, wiring routing in the power amplifier circuit 100 is reduced, and a reduction in size can be realized.

Power Amplifier Circuit 200 According to Second Embodiment Configuration

Figure 6:
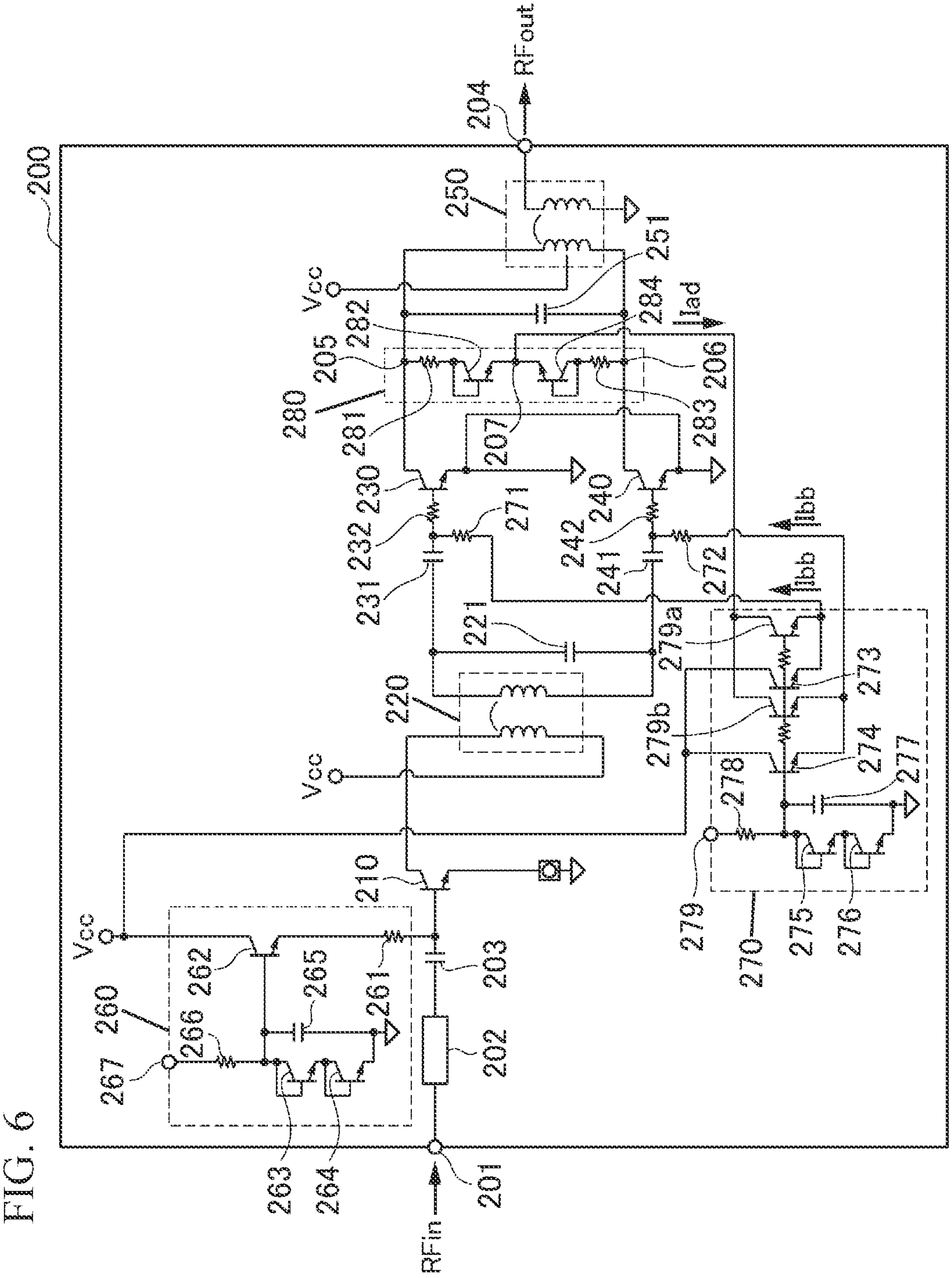
FIG. 6 illustrates an example of configuration of a power amplifier circuit 200 according to a second embodiment.

A power amplifier circuit 200 according to a second embodiment will be described below with reference to FIG. 6. FIG. 6 illustrates an example of configuration of the power amplifier circuit 200 according to the second embodiment. As illustrated in FIG. 6, the power amplifier circuit 200 is different from the power amplifier circuit 100 in configurations of an adjustment circuit 280 and a bias circuit 270. A transistor 210, a balun 220, transistors 230 and 240, a balun 250, and a bias circuit 260 are the same as the transistor 110, the balun 120, the transistors 130 and 140, the balun 150, and the bias circuit 160, respectively, and hence description of the former components is omitted.

In an example, the adjustment circuit 280 is a circuit for adjusting a gain of the power amplifier circuit 200 when the magnitude of the varying power supply voltage Vcc supplied to collectors of the transistor 230 and the transistor 240 increases. The adjustment circuit 280 is electrically connected between a node 205 which is disposed in a wiring between the collector of the transistor 230 and the balun 250 and a node 206 which is disposed in a wiring between the collector of the transistor 240 and the balun 250. More specifically, the adjustment circuit 280 includes, for example, a resistance 281 with one end connected to the node 205, and a diode 282 with an anode connected to the other end of the resistance 281 and a cathode connected to a connection point 207. The adjustment circuit 280 further includes, for example, a resistance 283 with one end connected to the node 206, and a diode 284 with an anode connected to the other end of the resistance 283 and a cathode connected to the connection point 207. The resistance 281 and the resistance 283 are, for example, resistance elements for adjusting a bias point. The diode 282 and the diode 284 each serves as, for example, a diode for a level shifter. In the adjustment circuit 280, the connection point 207 becomes a virtual ground because the transistor 230 and the transistor 240 form a differential amplifier circuit. Accordingly, the amplified signal RF1 and the amplified signal RF2 can be avoided from interfering with the bias circuit 270. Collectors of a transistor 279*a* and a transistor 279*b* in the bias circuit 270, described later, are connected to the connection point 207. The diode 282 and the diode 284 may be each a diode-connected bipolar transistor.

In an example, the bias circuit 270 supplies a bias current Ibb to each of bases of the transistors 230 and 240 through resistances 271 and 272, respectively. The bias circuit 270 includes transistors 273 and 274, diodes 275 and 276, a capacitor 277, and the transistors 279*a* and 279*b*. The diodes 275 and 276 and the capacitor 277 are the same as the diodes 175 and 176 and the capacitor 177, respectively, and hence description of the former components is omitted. The transistors 273 and 274 are each an emitter-follower transistor. Bases of the transistors 273 and 274 are connected to an anode of the diode 275 and are further connected to the ground through the capacitor 277. An emitter of the transistor 273 is connected to the base of the transistor 230 through the resistance 271. An emitter of the transistor 274 is connected to the base of the transistor 240 through the resistance 272.

The transistors 279*a* and 279*b* are each a transistor for adjusting the bias current Ibb applied to corresponding one of the transistors 230 and 240 depending on the varying power supply voltage Vcc. The collector of the transistor 279*a* is connected to the connection point 207. A base of the transistor 279*a* is connected to the base of the transistor 273. An emitter of the transistor 279*a* is connected to the emitter of the transistor 273 such that a current is added to the bias current Ibb output from the emitter of the transistor 273. The collector of the transistor 279*b* is connected to the connection point 207. A base of the transistor 279*b* is connected to the base of the transistor 274. An emitter of the transistor 279*b* is connected to the emitter of the transistor 274 such that a current is added to the bias current Ibb output from the emitter of the transistor 274.

Operation

Figure 7:
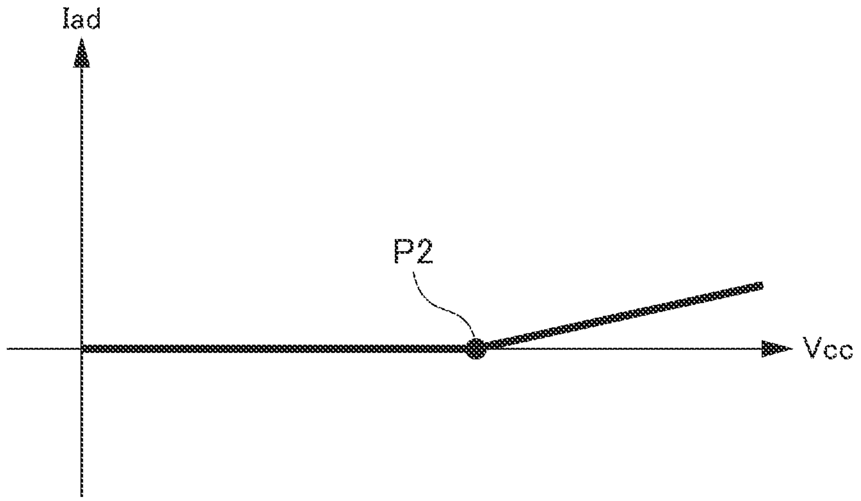
FIG. 7 is a graph indicating a relationship between the varying power supply voltage Vcc and an adjustment current Iad flowing from an adjustment circuit 280 to a bias circuit 270 in an operation of the power amplifier circuit 200.
Figure 8:
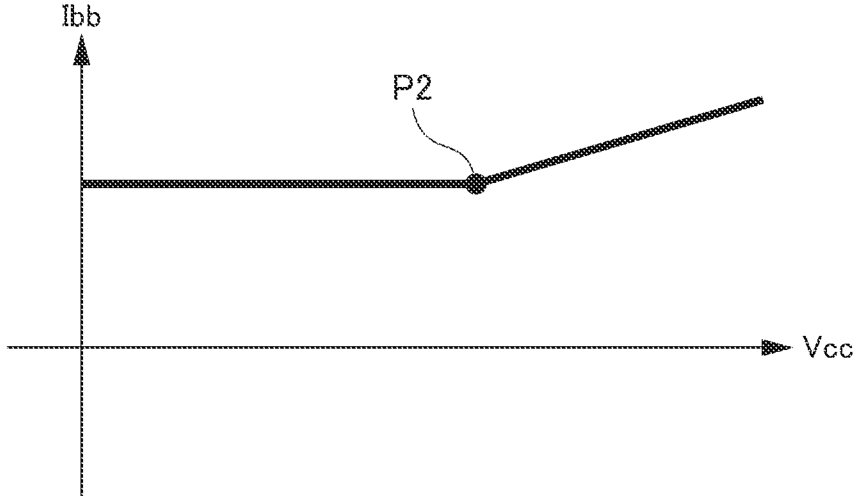
FIG. 8 is a graph indicating a relationship between the varying power supply voltage Vcc and a bias current Ibb flowing from the bias circuit 270 to each of a transistor 230 and a transistor 240 in the operation of the power amplifier circuit 200.

An operation of the power amplifier circuit 200 will be described below with reference to FIGS. 6, 7, and 8. FIG. 7 is a graph indicating a relationship between the varying power supply voltage Vcc and an adjustment current Iad flowing from the adjustment circuit 280 to the bias circuit 270 in the operation of the power amplifier circuit 200. In FIG. 7, the horizontal axis represents the varying power supply voltage Vcc, and the vertical axis represents the adjustment current Iad. FIG. 8 is a graph indicating a relationship between the varying power supply voltage Vcc and the bias current Ibb flowing from the bias circuit 270 to each of the transistor 230 and the transistor 240 in the operation of the power amplifier circuit 200. In FIG. 8, the horizontal axis represents the varying power supply voltage Vcc, and the vertical axis represents the bias current Ibb.

In the power amplifier circuit 200, when the varying power supply voltage Vcc exceeds above a total voltage value ("P2" in FIG. 7) resulting from adding a collector-emitter voltage Vce of the transistor 279*a*, a base-emitter voltage Vbe of the diode 282, and a voltage drop across the resistance 281 to a base potential Vb of the transistor 279*a*, the adjustment current Iad flows from the adjustment circuit 280 to the bias circuit 270. Similarly, when the varying power supply voltage Vcc exceeds above a total voltage value resulting from adding a collector-emitter voltage Vce of the transistor 279*b*, a base-emitter voltage Vbe of the diode 284, and a voltage drop across the resistance 283 to a base potential of the transistor 279*b*, the adjustment current Iad flows from the adjustment circuit 280 to the bias circuit 270.

More specifically, when the varying power supply voltage Vcc is low (for example, about 0 V), a collector voltage (for example, 0.6 V) of the transistor 279*a* and the transistor 279*b*, the collector voltage depending on the varying power supply voltage Vcc, becomes smaller than an emitter potential Ve (for example, about 1.2 V) of the transistor 279*a* and the transistor 279*b*. In this case, the adjustment current Iad does not flow to the transistor 279*a* and the transistor 279*b*. On the other hand, when the varying power supply voltage Vcc is high (for example, about 3.0 V), the collector voltage (for example, about 1.7 V) of the transistor 279*a* and the transistor 279*b* becomes larger than the emitter potential Ve (for example, about 1.2 V) of the transistor 279*a* and the transistor 279*b*. In this case, the adjustment current Iad flows to the transistor 279*a* and the transistor 279*b*.

Thus, since the adjustment current Iad output through each of the transistor 279*a* and the transistor 279*b* is added to the bias current Ibb output from corresponding one of the transistor 273 and the transistor 274, the bias current Ibb increases. Accordingly, as illustrated in FIG. 8, when the varying power supply voltage Vcc is high, the bias current Ibb supplied to each of the bases of the transistor 230 and the transistor 240 increases, whereby the gain of the power amplifier circuit 200 is increased. In other words, the adjustment circuit 280 operates to increase the gain of the power amplifier circuit 200 when the varying power supply voltage Vcc is high.

Power Amplifier Circuit 300 According to Third Embodiment Configuration

Figure 9:
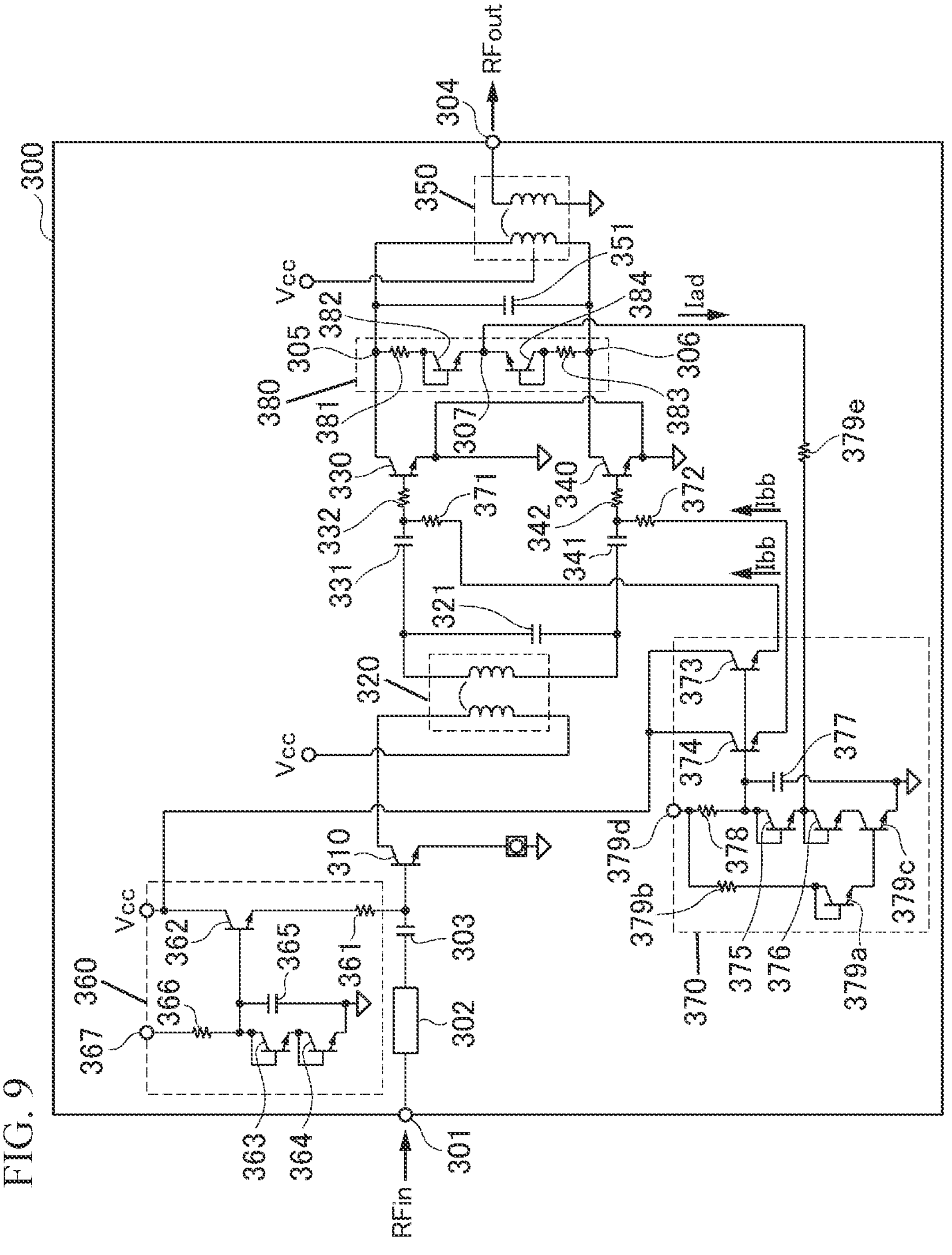
FIG. 9 illustrates an example of configuration of a power amplifier circuit 300 according to a third embodiment.

A power amplifier circuit 300 according to a third embodiment will be described below with reference to FIG. 9. FIG. 9 illustrates an example of configuration of the power amplifier circuit 300 according to the third embodiment. As illustrated in FIG. 9, the power amplifier circuit 300 is different from the power amplifier circuit 100 in configurations of an adjustment circuit 380 and a bias circuit 370. A transistor 310, a balun 320, transistors 330 and 340, a balun 350, and a bias circuit 360 are the same as the transistor 110, the balun 120, the transistors 130 and 140, the balun 150, and the bias circuit 160, respectively, and hence description of the former components is omitted. Moreover, the adjustment circuit 380 is the same as the adjustment circuit 280 in the power amplifier circuit 200, and hence description of the adjustment circuit 380 is omitted.

In an example, the bias circuit 370 supplies a bias current Ibb to each of bases of the transistors 330 and 340 through resistances 371 and 372, respectively. The bias circuit 370 includes transistors 373 and 374, diodes 375 and 376, a capacitor 377, a resistance 378, a diode 379*a*, a resistance 379*b*, and a transistor 379*c*. The transistors 373 and 374, the diodes 375 and 376, and the capacitor 377 are the same as the transistors 173 and 174, the diodes 175 and 176, and the capacitor 177, respectively, and hence description of the former components is omitted. Additionally, in the bias circuit 370, a connection point 307 in the adjustment circuit 380 is connected to an intermediate point between the diode 375 and the diode 376 through a resistance 379*e*.

A collector of the transistor 379*c* is electrically connected to a cathode of the diode 376. An emitter of the transistor 379*c* is electrically connected to the reference potential. A base of the transistor 379*c* is electrically connected to a cathode of the diode 379*a*. An anode of the diode 379*a* is connected to a power supply terminal 379*d* through the resistance 379*b*. The diode 379*a* serves as, for example, a diode for a level shifter. The power supply terminal 379*d* supplies a constant voltage or current. In other words, a base current is supplied to the base of the transistor 379*c* from the power supply terminal 379*d* through the resistance 379*b* and the diode 379*a*.

Operation

In the power amplifier circuit 300, when the varying power supply voltage Vcc exceeds above a total voltage value resulting from adding a voltage drop across the resistance 379*e*, a base-emitter voltage Vbe of the diode 382, and a voltage drop across the resistance 381 to a cathode potential Vn1 of the diode 375, an adjustment current Iad flows from the adjustment circuit 380 to the bias circuit 370. Similarly, when the voltage value of the varying power supply voltage Vcc exceeds above a total voltage value resulting from adding the voltage drop across the resistance 379*e*, a base-emitter voltage Vbe of the diode 384, and a voltage drop across the resistance 383 to the cathode potential Vn1 of the diode 375, an adjustment current Iad flows from the adjustment circuit 380 to the bias circuit 370.

More specifically, when the varying power supply voltage Vcc is low (for example, about 0 V), the cathode potential Vn1 (for example, about 1.2 V) of the diode 375 becomes larger than the varying power supply voltage Vcc. In this case, the adjustment current Iad does not flow from the adjustment circuit 380 toward the bias circuit 370. On the other hand, when the varying power supply voltage Vcc is high (for example, 3.0 V), the cathode potential Vn1 (for example, about 1.2 V) of the diode 375 becomes smaller than the varying power supply voltage Vcc. In this case, the adjustment current Iad flows from the adjustment circuit 380 toward the bias circuit 370.

With the adjustment current Iad flowing to the bias circuit 370, the cathode potential of the diode 375 increases. This increases a current supplied to each of the bases of the transistor 373 and the transistor 374. Accordingly, when the varying power supply voltage Vcc is high, the bias current Ibb supplied to each of the bases of the transistor 330 and the transistor 340 increases, whereby the gain of the power amplifier circuit 300 is increased. In other words, the adjustment circuit 380 operates to increase the gain of the power amplifier circuit 300 when the varying power supply voltage Vcc is high.

Furthermore, in the power amplifier circuit 300, a current flowing into the bias circuit 370 from the adjustment circuit 380 when the control voltage is in a standby state is suppressed by the diode 379*a*, the resistance 379*b*, and the transistor 379*c*. More specifically, in the power amplifier circuit 300, supposing, for example, the case that the diode 379*a*, the resistance 379*b*, and the transistor 379*c* are not disposed, a path through which the varying power supply voltage Vcc is supplied is formed through the resistances 381 and 383, the diodes 382 and 384, the resistance 379*e*, and the diode 376 is formed when viewed from the collectors of the transistors 330 and 340. In such a case, if the varying power supply voltage Vcc rises while the control voltage at the power supply terminal 379*d* is in the standby state, a current flows from the adjustment circuit 380 toward the bias circuit 370. To cope with the above point, in the power amplifier circuit 300, the diode 379*a*, the resistance 379*b*, and the transistor 379*c* are disposed such that the transistor 379*c* is turned off when the control voltage becomes 0 V, for example. As a result, in the power amplifier circuit 300, the path connecting to the reference potential through the resistances 381 and 383, the diodes 382, 384, the resistance 379*e*, and the diode 376 can be cut off. It is therefore possible to suppress the current flowing to the reference potential from the adjustment circuit 380 when the varying power supply voltage Vcc increases.

Power Amplifier Circuit 400 According to Fourth Embodiment Configuration

Figure 10:
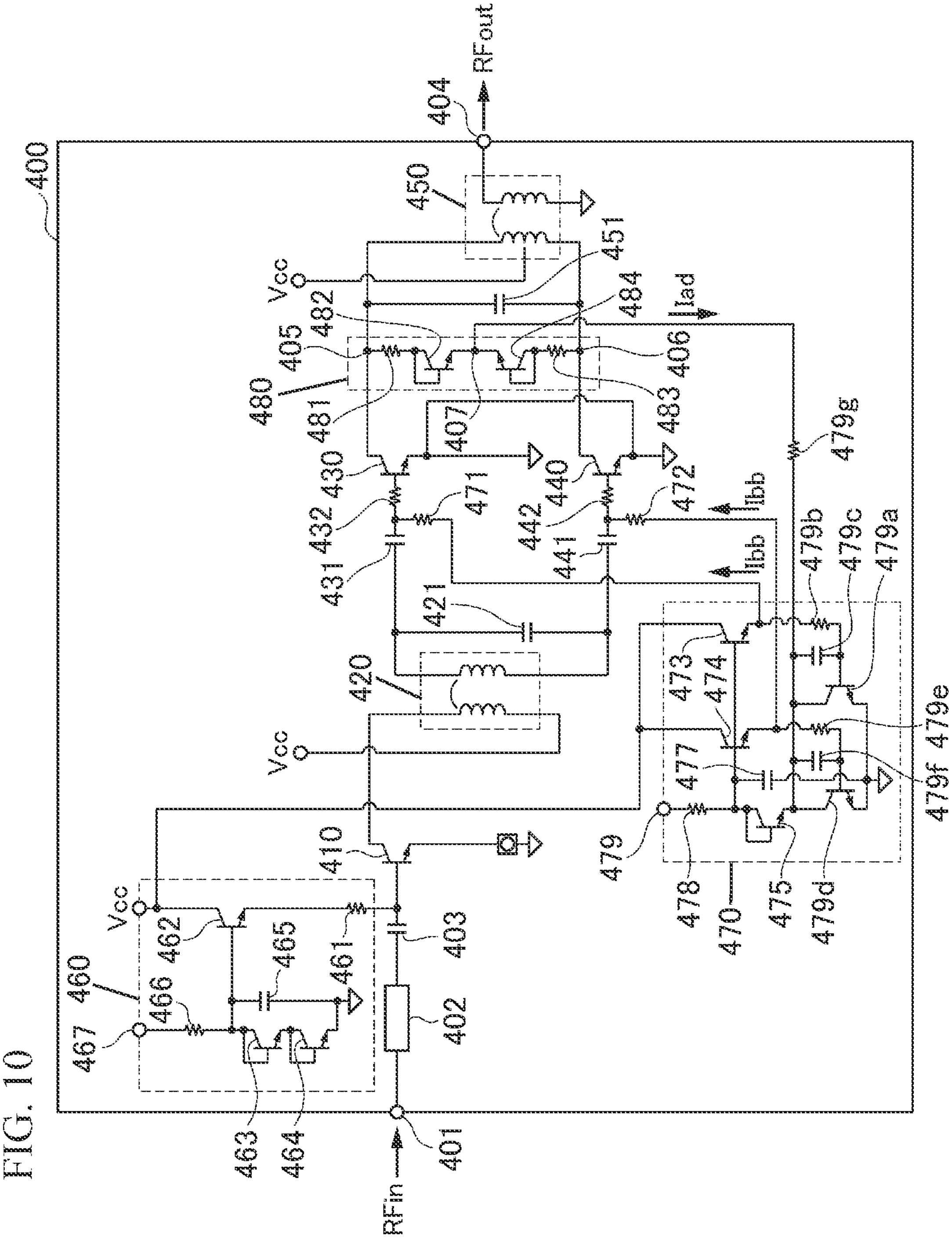
FIG. 10 illustrates an example of configuration of a power amplifier circuit 400 according to a fourth embodiment.

A power amplifier circuit 400 according to a fourth embodiment will be described below with reference to FIG. 10. FIG. 10 illustrates an example of configuration of the power amplifier circuit 400 according to the fourth embodiment. As illustrated in FIG. 10, the power amplifier circuit 400 is different from the power amplifier circuit 100 in configurations of an adjustment circuit 480 and a bias circuit 470. A transistor 410, a balun 420, transistors 430 and 440, a balun 450, and a bias circuit 460 are the same as the transistor 110, the balun 120, the transistors 130 and 140, the balun 150, and the bias circuit 160, respectively, and hence description of the former components is omitted. Moreover, the adjustment circuit 480 is the same as the adjustment circuit 280 in the power amplifier circuit 200, and hence description of the adjustment circuit 480 is omitted.

In an example, the bias circuit 470 supplies a bias current Ibb to each of bases of the transistors 430 and 440 through resistances 471 and 472, respectively. The bias circuit 470 includes transistors 473 and 474, a diode 475, a capacitor 477, transistors 479*a* and 479*d*, resistances 479*b* and 479*e*, capacitors 479*c* and 479*f*, and a resistance 479*g*. The transistors 473 and 474 are each an emitter-follower transistor. Bases of the transistors 473 and 474 are connected to an anode of the diode 475 and are further connected to the ground through the capacitor 477. The capacitor 477 serves as, for example, a capacitor for keeping constant base voltages of the transistors 473 and 474. An emitter of the transistor 473 is connected to the base of the transistor 430 through the resistance 471. An emitter of the transistor 474 is connected to the base of the transistor 440 through the resistance 472.

A collector of the transistor 479*a* is connected to a connection point 407 through the resistance 479*g*. The collector of the transistor 479*a* is further connected to a cathode of the diode 475. A base of the transistor 479*a* is connected to the emitter of the transistor 473 through the resistance 479*b*. An emitter of the transistor 479*a* is connected to the reference potential. In other words, a path extending from the emitter of the transistor 473 to the base of the transistor 473 through the resistance 479*b*, the transistor 479*a*, and the diode 475 is a feedback path. In an example, the collector and the base of the transistor 479*a* are connected to each other through the capacitor 479*c* for cutting a harmonic signal.

A collector of the transistor 479*d* is connected to the connection point 407 through the resistance 479*g*. The collector of the transistor 479*d* is further connected to the cathode of the diode 475. A base of the transistor 479*d* is connected to the emitter of the transistor 474 through the resistance 479*e*. An emitter of the transistor 479*d* is connected to the reference potential. In other words, a feedback path is formed in the bias circuit 470 by a path extending from the emitter of the transistor 474 to the base of the transistor 474 through the resistance 479*e*, the transistor 479*d*, and the diode 475. In an example, the collector and the base of the transistor 479*d* are connected to each other through the capacitor 479*f* for cutting a harmonic signal input to the base of the transistor 479*d*.

While, in the above, the capacitor 479*c* is described as connecting the collector and the base of the transistor 479*a* and the capacitor 479*f* is described as connecting the collector and the base of the transistor 479*d*, the present disclosure is not limited to that case. As another example, the capacitor 479*c* may be disposed to connect the base or the collector of the transistor 479*a* and the reference potential. Similarly, the capacitor 479*f* may be disposed to connect the base or the collector of the transistor 479*d* and the reference potential. In other words, the capacitors 479*c* and 479*f* just need to be able to cut the harmonic signal input to the transistor 479*a* and 479*d*, respectively, and there are no limitations on connection points of the capacitors 479*c* and 479*f*.

Operation

In the power amplifier circuit 400, when the varying power supply voltage Vcc exceeds above a total voltage value resulting from adding a voltage drop across the resistance 479*g*, a base-emitter voltage Vbe of the diode 482, and a voltage drop across the resistance 481 to a cathode potential Vn2 of the diode 475, an adjustment current Iad flows from the adjustment circuit 480 to the bias circuit 470. Similarly, when the voltage value of the varying power supply voltage Vcc exceeds above a total voltage value resulting from adding the voltage drop across the resistance 479*g*, a base-emitter voltage Vbe of the diode 484, and a voltage drop across the resistance 483 to the cathode potential Vn2 of the diode 475, an adjustment current Iad flows from the adjustment circuit 480 to the bias circuit 470.

More specifically, when the varying power supply voltage Vcc is low (for example, about 0 V), the cathode potential Vn2 (for example, about 1.2 V) of the diode 475 becomes larger than the varying power supply voltage Vcc. In this case, the adjustment current Iad does not flow from the adjustment circuit 480 toward the bias circuit 470. On the other hand, when the varying power supply voltage Vcc is high (for example, 3.0 V), the cathode potential Vn2 (for example, about 1.2 V) of the diode 475 becomes smaller than the varying power supply voltage Vcc. In this case, the adjustment current Iad flows from the adjustment circuit 480 toward the bias circuit 470.

With the adjustment current Iad flowing to the bias circuit 470, the cathode potential of the diode 475 increases. This increases a current supplied to each of the bases of the transistor 473 and the transistor 474. Accordingly, when the varying power supply voltage Vcc is high, the bias current Ibb supplied to each of the bases of the transistor 430 and the transistor 440 increases, whereby the gain of the power amplifier circuit 400 is increased. In other words, the adjustment circuit 480 operates to increase the gain of the power amplifier circuit 400 when the varying power supply voltage Vcc is high.

Furthermore, in the power amplifier circuit 400, the feedback circuit is formed by the path extending from the emitter of the transistor 474 to the base of the transistor 474 through the resistance 479*e*, the transistor 479*d*, and the diode 475. The feedback circuit stabilizes an output voltage of the bias circuit 470. More specifically, the feedback circuit including the transistor 473 operates such that, as an output current of the transistor 473 increases, a base current of the transistor 479*a* increases. This increases a current flowing from the power supply terminal 479 to the diode 475 and hence reduces a current flowing to the base of the transistor 473. Accordingly, the output voltage of the bias circuit 470 is stabilized. The above description is similarly applied to the feedback circuit including the transistor 474 as well.

Modifications

Figure 11:
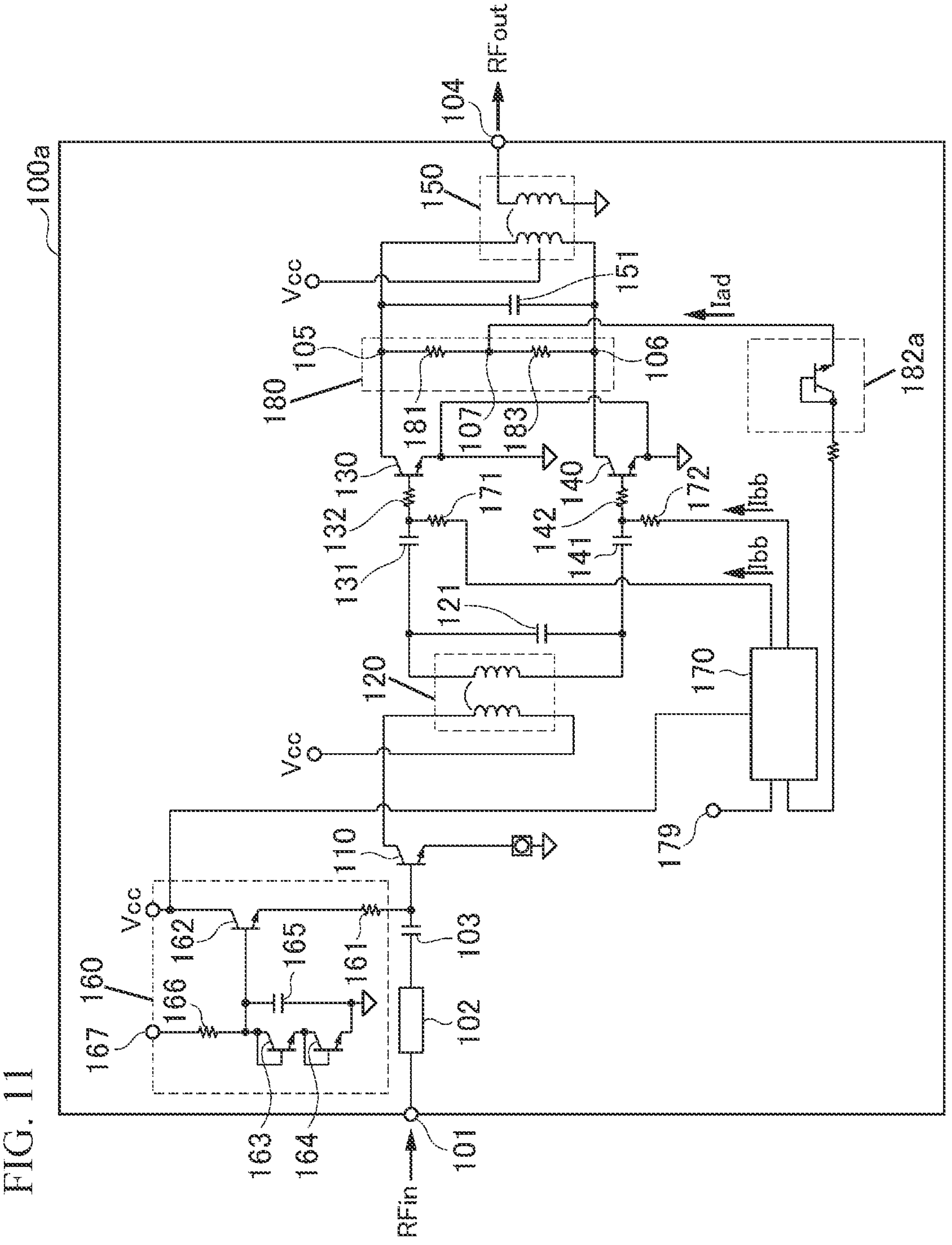
FIG. 11 illustrates an example of configuration of a power amplifier circuit 100*a* according to a modification.
Figure 12:
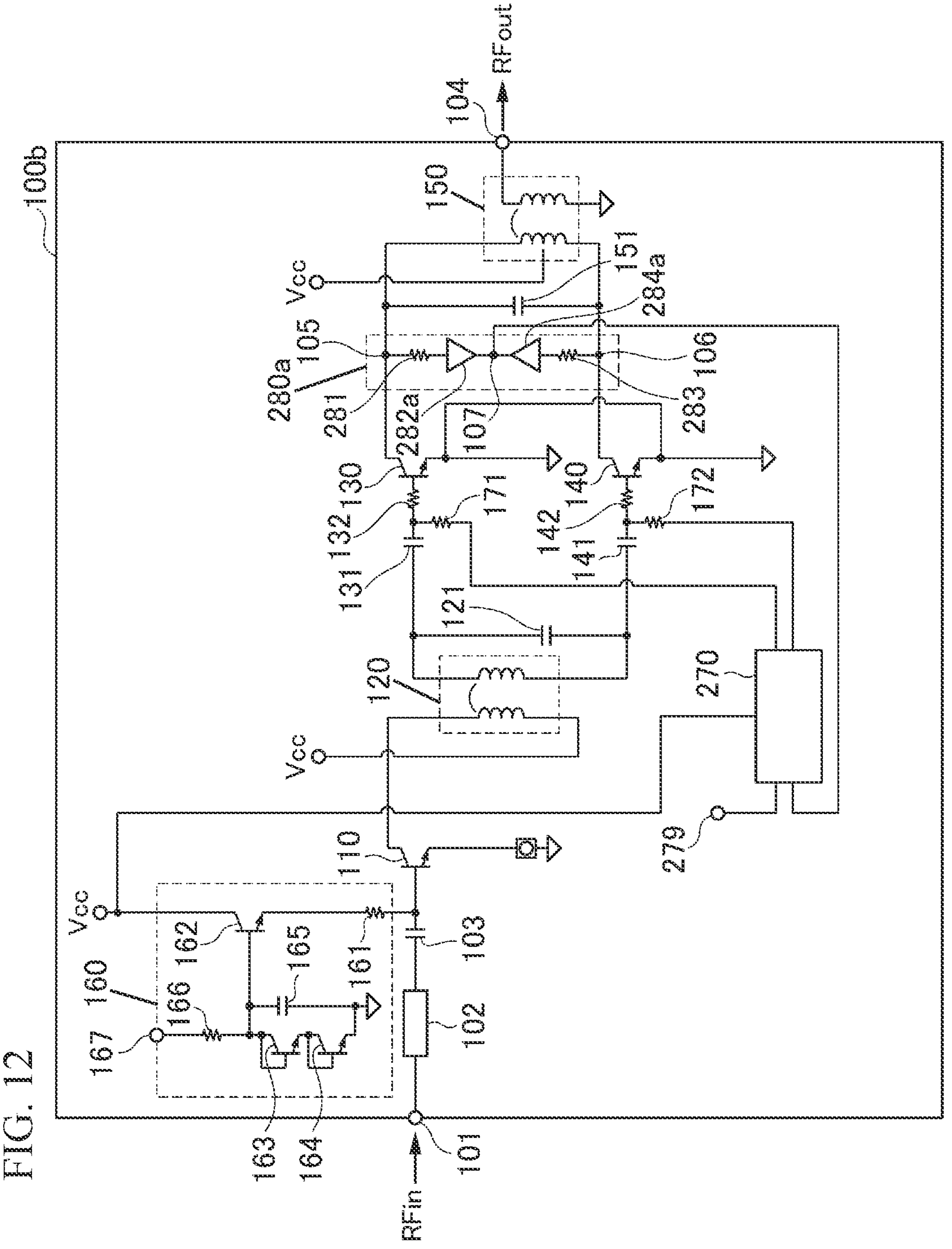
FIG. 12 illustrates an example of configuration of a power amplifier circuit 200*a* according to a modification.

Configurations of power amplifier circuits 100*a* and 200*a* according to modifications will be described below with reference to FIGS. 11 and 12, respectively. FIGS. 11 and 12 illustrate examples of the configurations of the power amplifier circuit 100*a* and 200*a* according to the modifications. In FIG. 11, components different from those of the power amplifier circuit 100 illustrated in FIG. 1 are illustrated, by way of example, and denoted by different signs from those in FIG. 1. In FIG. 12, components different from those of the power amplifier circuit 200 illustrated in FIG. 2 are illustrated, by way of example, and denoted by different signs from those in FIG. 2.

As illustrated in FIG. 11, the power amplifier circuit 100*a* includes an adjustment circuit 180*a*. In the adjustment circuit 180*a*, the resistance 181 and the resistance 183 are electrically connected to each other at the connection point 107, and a diode 182*a* is electrically connected between the connection point 107 and the bias circuit 170. The diode 182*a* has a cathode connected to the connection point 107 and an anode connected to the bias circuit 170. The diode 182*a* serve as, for example, a diode for a level shifter. The diode 182*a* may be, for example, a diode-connected transistor. According to the power amplifier circuit 100*a*, since one diode 182*a* is disposed instead of the diode 182 and the diode 184, a reduction in size can be realized as compared with the power amplifier circuit 100.

While a different portion from the adjustment circuit 180 in the power amplifier circuit 100 has been described, by way of example, in connection with FIG. 11, the present disclosure is not limited to that case. As another example, a diode with a cathode connected to the connection point 207 and an anode connected to the bias circuit 270 may be disposed instead of the diode 282 and the diode 284 of the power amplifier circuit 200 illustrated in FIG. 6.

As illustrated in FIG. 12, an adjustment circuit 280*a* in the power amplifier circuit 200*a* includes diodes 282*a* and 284*a*. The diodes 282*a* and 284*a* may be each a transistor that is diode-connected between a base and a collector or a transistor that is diode-connected between a base and an emitter.

Recapitulation

The power amplifier circuit 100 according to the first embodiment includes the transistor 130 (first amplification element) having the collector (output terminal) to which the varying power supply voltage Vcc (power supply voltage) is supplied and amplifying a harmonic signal input to the base (input terminal), the transistor 140 (second amplification element) forming the differential amplifier circuit in cooperation with the transistor 130 (first amplification element), having the collector (output terminal) to which the varying power supply voltage Vcc (power supply voltage) is supplied, and amplifying a harmonic signal input to the base (input terminal), the bias circuit 170 that supplies a bias to each of the base (input terminal) of the transistor 130 (first amplification element) and the base (input terminal) of the transistor 140 (second amplification element), the resistance 181 (first resistance element) with one end electrically connected to the collector (output terminal) of the transistor 130 (first amplification element), and the resistance 183 (second resistance element) with one end electrically connected to the collector (output terminal) of the transistor 140 (second amplification element) and the other end electrically connected to the other end of the resistance 181 (first resistance element) in series, wherein the bias circuit 170 is electrically connected to the connection point 107 in a portion in which the other end of the resistance 181 (first resistance element) and the other end of the resistance 183 (second resistance element) are electrically connected in series. With the above-described feature, the power amplifier circuit 100 can improve the characteristics of the gain dispersion while suppressing the current from interfering with the bias circuit 170.

The bias circuit 170 in the power amplifier circuit 100 according to the first embodiment is electrically connected to the connection point 107 that becomes the virtual ground based on a relationship between the resistance 181 (first resistance element) and the resistance 183 (second resistance element). With the above-described feature, the power amplifier circuit 100 can improve the characteristics of the gain dispersion while suppressing the current from interfering with the bias circuit 170.

In the power amplifier circuit 100 according to the first embodiment, depending on the power supply voltage supplied to the transistor 130 (first amplification element) and the power supply voltage supplied to the transistor 140 (second amplification element), the adjustment current serving as a current to adjust the bias is supplied from the connection point 107 to the bias circuit 170 or from the bias circuit 170 to the connection point 107. With the above-described feature, the power amplifier circuit 100 can improve the characteristics of the gain dispersion.

The power amplifier circuit 100 according to the first embodiment further includes the diode 182*a* electrically connected in series between the connection point 107 and the bias circuit 170. With the above-described feature, the power amplifier circuit 100 can improve the characteristics of the gain dispersion with a simple configuration while suppressing the current from interfering with the bias circuit 170.

The power amplifier circuit 100 according to the first embodiment further includes the diode 182 (second diode) electrically connected to the resistance 181 (first resistance element) in series between the collector (output terminal) of the transistor 130 (first amplification element) and the connection point 107, and the diode 184 (third diode) electrically connected to the resistance 183 (second resistance element) in series between the collector (output terminal) of the transistor 140 (second amplification element) and the connection point 107. With the above-described feature, the power amplifier circuit 100 can improve the characteristics of the gain dispersion while suppressing the current from interfering with the bias circuit 170.

In the power amplifier circuit 100 according to the first embodiment, the diode 182 (second diode) has the cathode electrically connected to the collector (output terminal) of the transistor 130 (first amplification element) and the anode electrically connected to the connection point 107, and the diode 184 (third diode) has the cathode electrically connected to the collector (output terminal) of the transistor 140 (second amplification element) and the anode electrically connected to the connection point 107. With the above-described feature, the power amplifier circuit 100 can improve the characteristics of the gain dispersion in the power amplifier circuit 100 when the varying power supply voltage Vcc is small. Moreover, even when a slight shift from the virtual ground is caused at the connection point 107, the power amplifier circuit 100 can suppress the harmonic signal from interfering with the bias circuit 170.

In the power amplifier circuit 100 according to the first embodiment, the diode 182 (second diode) and the diode 184 (third diode) are each a diode-connected transistor in which a base or a gate and a collector or a drain are electrically connected. With the above-described feature, the power amplifier circuit 100 can increase a breakdown voltage and can realize a stable circuit.

The bias circuit 170 in the power amplifier circuit 100 according to the first embodiment includes the transistor 173 (first transistor) having the collector or the drain to which the varying power supply voltage Vcc is supplied and the emitter or the source electrically connected to the base (input terminal) of the transistor 130 (first amplification element), and the transistor 174 (second transistor) having the collector or the drain to which the varying power supply voltage Vcc is supplied and the emitter or the source electrically connected to the base (input terminal) of the transistor 140 (second amplification element), and the bases or the gates of the transistor 173 (first transistor) and the transistor 174 (second transistor) are electrically connected to the reference potential through the diodes 175 and 176 (fourth diode) and are electrically connected to the connection point 107. With the above-described feature, the power amplifier circuit 100 can improve the characteristics of the gain dispersion when the varying power supply voltage Vcc is small.

The bias circuit 170 in the power amplifier circuit 100 according to the first embodiment further includes the capacitor 177 (first capacitor) disposed electrically in parallel to the diodes 175 and 176 (fourth diode) and electrically connected between the base or the gate of the transistor 173 (first transistor) and the reference potential. With the above-described feature, the power amplifier circuit 100 can keep constant the base voltages of the transistors 173 and 174 and hence can stabilize the bias.

In the power amplifier circuit 200 according to the second embodiment, the diode 282 (second diode) has the anode electrically connected to the collector (output terminal) of the transistor 230 (first amplification element) and the cathode electrically connected to the connection point 207, and the diode 284 (third diode) has the anode electrically connected to the collector (output terminal) of the transistor 240 (second amplification element) and the cathode electrically connected to the connection point 207. With the above-described feature, the power amplifier circuit 200 can improve the characteristics of the gain dispersion when the varying power supply voltage Vcc is large.

In the power amplifier circuit 200 according to the second embodiment, the diode 282 (second diode) and the diode 282 (third diode) are each a diode-connected transistor in which a base or a gate and a collector or a drain are electrically connected. With the above-described feature, the power amplifier circuit 200 can improve the characteristics of the gain dispersion when the varying power supply voltage Vcc is large. Moreover, even when a slight shift from the virtual ground is caused at the connection point 207, the power amplifier circuit 200 can suppress the harmonic signal from interfering with the bias circuit 270.

The bias circuit 270 in the power amplifier circuit 200 according to the second embodiment includes the transistor 273 (first transistor) having the collector or the drain to which the varying power supply voltage Vcc is supplied and the emitter or the source electrically connected to the base (input terminal) of the transistor 230 (first amplification element), the transistor 274 (second transistor) having the collector or the drain to which the varying power supply voltage Vcc is supplied and the emitter or the source electrically connected to the base (input terminal) of the transistor 240 (second amplification element), the transistor 279*a* (third transistor) having the base or the gate electrically connected to the base or the gate of the transistor 273 (first transistor), the collector or the drain electrically connected to the connection point 207, and the emitter or the source electrically connected to the emitter or the source of the transistor 273 (first transistor), and the transistor 279*b* (fourth transistor) having the base or the gate electrically connected to the base or the gate of the transistor 274 (second transistor), the collector or the drain electrically connected to the connection point 207, and the emitter or the source electrically connected to the emitter or the source of the transistor 274 (second transistor), wherein the bases or the gates of the transistor 273 (first transistor) and the transistor 274 (second transistor) are electrically connected to the reference potential through the diodes 275 and 276 (fourth diode). With the above-described feature, the power amplifier circuit 200 can improve the characteristics of the gain dispersion when the varying power supply voltage Vcc is large.

The bias circuit 370 in the power amplifier circuit 300 according to the third embodiment includes the transistor 373 (first transistor) having the collector or the drain to which the varying power supply voltage Vcc is supplied and the emitter or the source electrically connected to the base (input terminal) of the transistor 330 (first amplification element), the transistor 374 (second transistor) having the collector or the drain to which the varying power supply voltage Vcc is supplied and the emitter or the source electrically connected to the base (input terminal) of the transistor 340 (second amplification element), and the transistor 379*c* (fifth transistor) having the collector or the drain electrically connected to the bases or the gates of the transistor 373 (first transistor) and the transistor 374 (second transistor) through the diodes 375 and 376 (fourth diode), the base or the gate to which a power supply voltage is supplied through the resistance 379*b* (fifth resistance element), and the emitter or the source electrically connected to the reference potential. With the above-described feature, it is possible to suppress the current flowing from the adjustment circuit 380 to the reference potential when the varying power supply voltage Vcc increases.

The bias circuit 470 in the power amplifier circuit 400 according to the fourth embodiment includes the transistor 473 (first transistor) having the collector or the drain to which the varying power supply voltage Vcc is supplied and the emitter or the source electrically connected to the base (input terminal) of the transistor 430 (first amplification element), the transistor 474 (second transistor) having the collector or the drain to which the varying power supply voltage Vcc is supplied and the emitter or the source electrically connected to the base (input terminal) of the transistor 440 (second amplification element), the transistor 479*a* (sixth transistor) having the base or the gate electrically connected to the emitter or the source of the transistor 473 (first transistor) and the emitter or the source electrically connected to the reference potential, the capacitor 479*c* (second capacitor) that cuts a harmonic signal input to the base or the gate of the transistor 479*a* (sixth transistor) from the connection point 407, the transistor 479*d* (seventh transistor) having the base or the gate electrically connected to the emitter or the source of the transistor 474 (second transistor) and the emitter or the source electrically connected to the reference potential, and the capacitor 479*f* (third capacitor) that cuts a harmonic signal input to the base or the gate of the transistor 479*d* (seventh transistor) from the connection point 407. With the above-described feature, the output voltage of the bias circuit 470 is stabilized.

The above-described embodiments are given to make easier understanding of the present disclosure and are not intended to impose limitations on interpretation of the present disclosure. The present disclosure can be modified or improved insofar as modifications and improvements do not depart from the gist of the present disclosure, and matters equivalent to those included in the modifications and the improvements also fall within the scope of the present disclosure. In other words, matters conceivable by those skilled in the art with design changes of the embodiments also fall within the scope of the present disclosure insofar as those matters have the features of the present disclosure. The elements included in the embodiments, arrangements of the elements, and so on are not limited to the illustrated ones and can be changed as appropriate.

What is claimed is:

1. A power amplifier circuit comprising:

a first amplification circuit element comprising an output terminal to which a power supply voltage is supplied and configured to amplify a harmonic signal input to an input terminal of the first amplification circuit element;

a second amplification circuit element comprising an output terminal to which the power supply voltage is supplied, and configured to amplify the harmonic signal input to an input terminal of the second amplification circuit element;

a bias circuit that configured to supply a bias to each of the input terminal of the first amplification circuit element and the input terminal of the second amplification circuit element;

a first resistance circuit element comprising one end electrically connected to the output terminal of the first amplification circuit element; and a second resistance circuit element comprising one end electrically connected to the output terminal of the second amplification circuit element and a second end electrically connected to a second end of the first resistance circuit element in series;

wherein the bias circuit is electrically connected to a connection point in a portion in which the second end of the first resistance circuit element and the second end of the second resistance circuit element are electrically connected in series, and wherein the power amplifier circuit further comprises:

a second diode electrically connected to the first resistance circuit element in series between the output terminal of the first amplification circuit element and the connection point; and a third diode electrically connected to the second resistance circuit element in series between the output terminal of the second amplification circuit element and the connection point.

2. The power amplifier circuit according to claim 1, wherein the bias circuit is electrically connected to the connection point that becomes a virtual ground based on a relationship between the first amplification circuit element and the second amplification circuit element.

3. The power amplifier circuit according to claim 1, wherein, depending on the power supply voltage supplied to the first amplification circuit element and the power supply voltage supplied to the second amplification circuit element, an adjustment current is supplied from the connection point to the bias circuit or from the bias circuit to the connection point, the adjustment current comprising a current configured to adjust the bias.

4. The power amplifier circuit according to claim 1, further comprising: a first diode electrically connected in series between the connection point and the bias circuit.

5. The power amplifier circuit according to claim 1, wherein the second diode comprises a cathode electrically connected to the output terminal of the first amplification circuit element and an anode electrically connected to the connection point, and the third diode comprises a cathode electrically connected to the output terminal of the second amplification circuit element and an anode electrically connected to the connection point.

6. The power amplifier circuit according to claim 1, wherein the second diode and the third diode each comprise a diode-connected transistor in which a base or a gate and a collector or a drain are electrically connected.

7. The power amplifier circuit according to claim 5, wherein the bias circuit comprises:

a first transistor comprising a collector or a drain to which the power supply voltage is supplied and an emitter or a source electrically connected to the input terminal of the first amplification circuit element; and a second transistor comprising a collector or a drain to which the power supply voltage is supplied and an emitter or a source electrically connected to the input terminal of the second amplification circuit element, and wherein bases or gates of the first transistor and the second transistor are electrically connected a reference potential through a fourth diode and are electrically connected to the connection point.

8. The power amplifier circuit according to claim 7, wherein the bias circuit further comprises a first capacitor in parallel to the fourth diode and electrically connected between the base or the gate of the first transistor and the reference potential.

9. The power amplifier circuit according to claim 1, wherein the second diode comprises: an anode electrically connected to the output terminal of the first amplification circuit element and a cathode electrically connected to the connection point, and the third diode comprises an anode electrically connected to the output terminal of the second amplification circuit element and a cathode electrically connected to the connection point.

10. The power amplifier circuit according to claim 9, wherein the second diode and the third diode each comprise a diode-connected transistor in which a base or a gate and a collector or a drain are electrically connected.

11. The power amplifier circuit according to claim 9, wherein the bias circuit comprises:

a first transistor comprising a collector or a drain to which the power supply voltage is supplied and an emitter or a source electrically connected to the input terminal of the first amplification circuit element;

a second transistor comprising a collector or a drain to which the power supply voltage is supplied and an emitter or a source electrically connected to the input terminal of the second amplification circuit element;

a third transistor comprising a base or a gate electrically connected to a base or a gate of the first transistor, a collector or a drain electrically connected to the connection point, and an emitter or a source electrically connected to the emitter or the source of the first transistor; and a fourth transistor comprising a base or a gate electrically connected to a base or a gate of the second transistor, a collector or a drain electrically connected to the connection point, and an emitter or a source electrically connected to the emitter or the source of the second transistor, and wherein bases or gates of the first transistor and the second transistor are electrically connected to a reference potential through a fourth diode.

12. The power amplifier circuit according to claim 9, wherein the bias circuit comprises:

a first transistor comprising a collector or a drain to which the power supply voltage is supplied and an emitter or a source electrically connected to the input terminal of the first amplification circuit element;

a second transistor comprising a collector or a drain to which the power supply voltage is supplied and an emitter or a source electrically connected to the input terminal of the second amplification circuit element; and a fifth transistor comprising a collector or a drain electrically connected to bases or gates of the first transistor and the second transistor through a fourth diode, a base or a gate to which a power supply voltage is supplied through a fifth resistance circuit element, and an emitter or a source electrically connected to a reference potential.

13. The power amplifier circuit according to claim 9, wherein the bias circuit comprises:

a first transistor comprising a collector or a drain to which the power supply voltage is supplied and an emitter or a source electrically connected to the input terminal of the first amplification circuit element;

a second transistor comprising a collector or a drain to which the power supply voltage is supplied and an emitter or a source electrically connected to the input terminal of the second amplification circuit element;

a sixth transistor comprising a base or a gate electrically connected to the emitter or the source of the first transistor and an emitter or a source electrically connected to a reference potential;

a second capacitor that cuts the harmonic signal input to the base or the gate of the sixth transistor from the connection point;

a seventh transistor comprising a base or a gate electrically connected to the emitter or the source of the second transistor and an emitter or a source electrically connected to the reference potential; and a third capacitor that cuts the harmonic signal input to the base or the gate of the seventh transistor from the connection point.

14. The power amplifier circuit according to claim 1, wherein the first amplification circuit element and the second amplification circuit element constitute a differential amplifier circuit.

15. The power amplifier circuit according to claim 2, wherein, depending on the power supply voltage supplied to the first amplification circuit element and the power supply voltage supplied to the second amplification circuit element, an adjustment current is supplied from the connection point to the bias circuit or from the bias circuit to the connection point, the adjustment current comprising a current configured to adjust the bias.

16. The power amplifier circuit according to claim 2, further comprising: a first diode electrically connected in series between the connection point and the bias circuit.

17. The power amplifier circuit according to claim 3, further comprising: a first diode electrically connected in series between the connection point and the bias circuit.

* * * * *